United States Patent [19]

Okamoto et al.

[11] Patent Number: 4,583,074
[45] Date of Patent: Apr. 15, 1986

[54] EXPANSION CIRCUIT FOR DIGITAL SIGNALS
[75] Inventors: Hiroo Okamoto; Tsutomu Noda; Takao Arai, all of Yokohama, Japan
[73] Assignee: Hitachi, Ltd., Tokyo, Japan
[21] Appl. No.: 527,358
[22] Filed: Aug. 29, 1983
[30] Foreign Application Priority Data
Aug. 30, 1982 [JP] Japan .................. 57-149304
[51] Int. Cl.⁴ .............................. H04L 3/00
[52] U.S. Cl. .................. 340/347 DD; 340/347 M
[58] Field of Search ............. 340/347 DD, 347 M
[56] References Cited
U.S. PATENT DOCUMENTS

| | | | |
|---|---|---|---|
| 3,755,808 | 8/1973 | Candiani | 340/347 DD |
| 3,778,605 | 12/1973 | Montgomery | 340/347 DD |
| 3,798,635 | 3/1974 | Candiani | 340/347 DD |
| 4,040,049 | 8/1977 | Messerschmitt | 340/347 DD |
| 4,168,513 | 9/1979 | Hains | 340/347 DD |

Primary Examiner—B. Dobeck
Attorney, Agent, or Firm—Antonelli, Terry & Wands

[57] ABSTRACT

A PCM signal processor which converts an analog signal into a digital signal to transmit or record the digital signal. When the PCM signal processor receives a PCM signal whose data has been compressed in such a manner that one or more lower bits are cut off from a plurality of bits for forming the PCM signal and indicating the signal level of the analog signal, in accordance with the signal level of the analog signal, one or more bits corresponding to the number of bits having been cut off are added in the processor to the compressed PCM signal at the position following the least significant bit of the compressed PCM signal. Correction data indicating about one half the largest one of numerical values that can be expressed by the added bit or bits, is given to the added bit or bits.

2 Claims, 9 Drawing Figures

EXPANSION CIRCUIT FOR DIGITAL SIGNALS

The present invention relates to an expansion circuit for expanding the amplitude of compressed signal to its original value, and more particularly to an expansion circuit for digital signals which is used in the case where an analog signal is converted into a PCM signal, the amount of data of the PCM signal is compressed, the PCM signal thus compressed is transmitted or recorded in a recording medium, and the amount of data of the compressed PCM signal is expanded to an original amount to demodulate the transmitted or recorded signal.

In the case where an analog signal such as an audio signal is sampled by a sampling signal, a sampled value thus obtained is quantized and digitized to be converted into a PCM signal, and the PCM signal is transmitted through a transmission line, the amount of data of the PCM signal is compressed and the PCM signal thus compressed is transmitted if the transmission capacity of the transmission line is insufficient. For example, one sampled value expressed by a 10-bit PCM signal is compressed into an 8-bit signal, which is transmitted through the transmission line.

Further, it has been proposed that, in a magnetic recording/reproducing device for magnetically recording the video and audio signals of a TV signal on a magnetic tape and for reproducing the recorded signals, the audio signal is converted into a PCM signal and the PCM signal thus obtained is recorded in a portion of a video track on the magnetic tape.

In the magnetic recording/reproducing device, the video signal is recorded on the magnetic tape obliquely with respect to the longitudinal direction thereof by means of a plurality of rotating video heads. In other words, the magnetic recording/reproducing device is of helical scanning type. About four fifths of the total length of the video track is used to record the video signal by the video heads, and the remaining one fifth of the video track is used to record the PCM signal obtained from the audio signal, by the video heads. The amount of data of the PCM signal recorded in the video track is compressed, since that portion of the video track which is used to record the PCM signal, is small in length. That is, the audio signal which is an analog signal, is sampled, the sampled value thus obtained is converted into a 10-bit digital signal, and the 10-bit digital signal is compressed into an 8-bit signal, which is recorded in the video track.

Accordingly, in the case where an 8-bit PCM signal, the amount of data of which has been compressed for the above-mentioned reason, is received or reproduced, and then demodulated, it is required to expand the 8-bit PCM signal to a 10-bit PCM signal and convert the 10-bit PCM signal into an audio signal.

In the case where the 10-bit PCM signal indicating one sampled value is compressed into the 8-bit PCM signal, a compression circuit operates in such a manner that the 10-bit PCM signal is left uncompressed when the amplitude of the audio signal is small, and is compressed when the amplitude of the audio signal is large. In more detail, when the amplitude of the audio signal is small, noise is readily observed and therefore the PCM signal is left uncompressed. When the amplitude of the audio signal is large, one or more lower bits of the PCM signal are cut off to compress the data thereof. That is, when the amplitude of the audio signal is small, eight lower bits of a 10-bit PCM signal indicating the above amplitude are taken out to be delivered. When the audio signal takes a high level, one or two lower bits of a 10-bit PCM signal indicating the ampltidue of the audio signal are cut off, and eight lower bits of the 9-bit or 8-bit signal thus obtained are taken out to be delivered.

In the case where a PCM signal recorded or transmitted in the state that the amount of data of the PCM signal is compressed, is demodulated, it is required to expand the compressed data to original data. When data is expanded, it is required to expand the data in accordance with the degree of compression of the data. That is, one or more bits corresponding to the number of bits which were cut off from a 10-bit PCM signal when the PCM signal was compressed, are added to the compressed PCM signal at the position following the least significant bit of the compressed PCM signal and further one or more bits are added to the compressed PCM signal at an upper bit portion thereof, to convert the compressed PCM signal into the 10-bit PCM signal. However, a numerical value indicated by one or more bits which were cut off when the PCM signal was compressed, cannot be estimated when the compressed PCM signal is expanded. Therefore, a numerical value "0" is generally given to one or more bits which are added to the compressed PCM signal at the position following the least significant bit of the compressed PCM signal. Accordingly, it is impossible to reproduce the original PCM signal by expanding the compressed PCM signal, and therefore a distortion is generated in an output signal obtained by expanding the compressed signal.

It is accordingly an object of the present invention to provide an expansion circuit for digital signals which is able to reduce the distortion of the output signal from the expansion circuit.

In order to attain the above object, according to the present invention, there is provided an expansion circuit for digital signal, in which a digital signal whose data has been compressed, is supplied to bit-adding means, one or more bits corresponding to the number of bits which were cut off when a digital signal indicating a sampled value of an analog signal and including a plurality of bits was compressed, are added to the compressed digital signal at the position following the least significant bit of the compressed digital signal to form an expanded digital signal, and a numerical value which is about one half the largest one of numerical values represented by one or more bits thus added, is given to one or more added bits, to reduce the distortion of the expanded digital signal.

The present invention will become more apparent from the following detailed description taken in conjunction with the accompanying drawings, in which.

Figure 1:
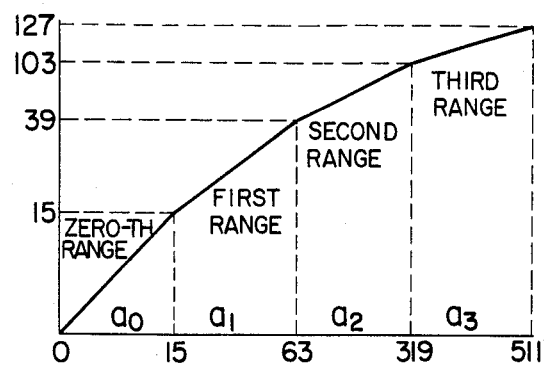
FIG. 1 is a graph showing the compression-characteristic of a conventinal compression circuit.

Prior to explaining a nonlinear expansion circuit according to the present invention, a method and an operation for nonlinearly compressing the data of a PCM signal will first be explained. FIG. 1 shows the compression characteristic of a nonlinear compression circuit. In FIG. 1, the abscissa indicates the signal level of input signal, and the ordinate the signal level of compressed output signal. An input signal applied to the compression circuit includes positive and negative signals, and the compression characteristic for the positive signal is similar to that for the negative signal. Therefore, only the compression characteristic for the positive signal is shown in FIG. 1. The input signal is a 10-bit digital signal indicating a sampled value which is obtained by sampling an analog signal. A bit group which includes ten bits to indicate one sampled value, is called one block. Now, explanation will be made on the case where the compressed output signal from the compression circuit is an 8-bit digital signal, by way of example. A maximum numerical value expressed by a 10-bit digital signal is 1024 in decimal notation. In the case where an analog audio signal is subjected to a sampling operation and a sampled value is converted into a 10-bit digital signal, both positive and negative parts of the audio signal are expressed by the digital signal. Accordingly, when the audio signal takes zero level, the signal level is expressed by "0" in decimal notation. When the audio signal takes a positive level, the positive level is expressed by a numerical value of 1 to 511 in decimal notation. Further, a negative signal level of the audio signal is expressed by a numerical value of $-1$ to $-512$ in decimal notation.

Accordingly, an input signal whose signal level is expressed by decimal number within a range from 0 to 511, is used in the compression characteristic shown in FIG. 1. An actual compression circuit is applied with a 10-bit digital signal which indicates a binary number corresponding to the above-mentioned decimal number. The compression characteristic shown in FIG. 1 is divided into four ranges, that is, the zero-th range $a_0$ in which the signal level of input signal takes a value of 0 to 15, the first range $a_1$ in which the signal level of input signal takes a value of 16 to 63, the second range $a_2$ in which the signal level of input signal takes a value of 64 to 319, and the third range $a_3$ in which the signal level of input signal takes a value of 320 to 511.

When the signal level of input signal lies within the zero-th range $a_0$, the compression circuit does not compress the input signal. Thus, the input signal is left uncompressed, and only eight lower bits of the input signal (namely, the 10-bit signal) are taken out to be delivered. In more detail, an input signal whose signal level lies within a range from 0 to 15, namely, from (0000000000) to (0000001111), is taken out as it is, and only eight lower bits of the 10-bit input signal are taken out. Thus, the output signal indicates a binary number of (00000000) to (00001111). In the case where the signal level of input signal lies in the first range $a_1$, that is, takes a value of 16 to 63, the least significant bit of a 10-bit input signal is cut off, and an offset value 8 is added to the input signal thus processed. Accordingly, the signal level of output signal takes a value of 16 to 39. In more detail, when a 10-bit PCM signal (0000010000) indicating a binary number corresponding to a decimal number 16 is applied to the compression circuit, the least significant bit of the 10-bit PCM signal is cut off, and thus a binary number (000001000) is obtained. This binary number corresponds to a decimal number 8. That is, the numerical number 16 is reduced to the numerical number 8. However, the numerical number 8 thus obtained cannot be descriminated from a numerical value 8 in the zero-th range $a_0$. Therefore, the offset value 8 is added to the binary number (000001000), and only eight lower bits of the binary number thus obtained are taken out. In this manner, an 8-bit binary number (00010000) corresponding to a decimal number 16 is outputted as a compressed signal. Similarly, a 10-bit signal indicating a binary number corresponding to a decimal number 63 is expressed by (0000111111), and the least significant bit of this 10-bit signal is cut off. Thus, a binary number (000011111) is obtained which corresponds to a decimal number 31. The offset value 8 is added to the decimal number 31, and thus a numerical value 39, that is, an 8-bit signal (00100111) is outputted. In the case where the signal level of input signal lies in the second range $a_2$, that is, takes a value of 64 to 319, the compression circuit cuts off two lower bits of a 10-bit input signal to compress the input signal. That is, two lower bits of a 10-bit PCM signal (0001000000) indicating a binary number corresponding to a decimal number 64 are cut off, and thus an 8-bit signal (00010000) is obtained. This signal corresponds to a decimal number 16. An offset value 24 is added to the 8-bit signal, and thus an 8-bit signal (00101000) is outputted. In the case where the signal level of input signal lies in the third range $a_3$, that is, takes a value of 320 to 511, the compression circuit cuts off three lower bits of a 10-bit input signal to compress the input signal. That is, three lower bits of a 10-bit PCM signal (0101000000) indicating a binary number corresponding to a decimal number 320 are cut off, and thus a 7-bit signal (0101000) is obtained. This signal corresponds to a decimal number 40. An offset value 64 is added to the 7-bit signal, and then an 8-bit signal (01101000) corresponding to a decimal number 104 is outputted. Similarly, three lower bits of a 10-bit PCM signal (0111111111) indicating that the signal level of input signal is equal to 511, are cut off, and thus a 7-bit signal (0111111) is obtained. This 7-bit signal corresponds to a decimal number 63. The offset value 64 is added to the 7-bit signal, and then an 8-bit signal (01111111) corresponding to a decimal number 127 is outputted.

As mentioned above, a 10-bit PCM signal is converted into an 8-bit PCM signal. In the signal conversion, an input signal whose signal level is low, is not compressed, and the degree of compression is made large as the signal level of input signal is higher. A compression circuit for performing such operations includes a shift register for cutting off one or more lower bits of a 10-bit input signal, a register for storing therein offset values, and an adder for adding one of the offset values to the content of the shift register.

Figure 2:
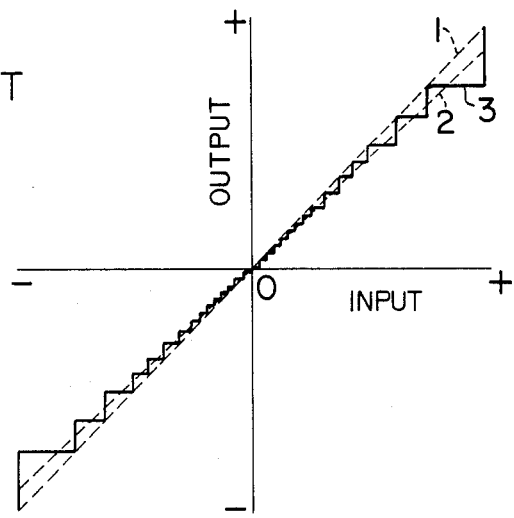
FIG. 2 is a graph showing the input-output characteristic of a conventional expansion circuit.

The compression characteristic shown in FIG. 1 can be expressed by a quantization characteristic shown in FIG. 2. The output signal of the compression circuit is given by a stepwise characteristic 3 shown in FIG. 2. As is apparent from FIG. 2, the output signal is finely quantized in a region where the signal level of input signal is low, and is coarsely quantized in a region where the signal level of input signal is high.

Figure 3:
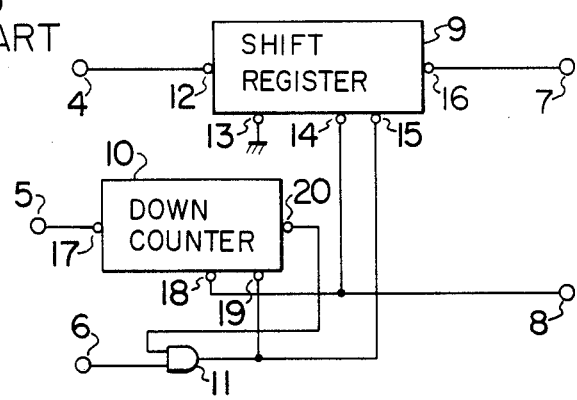
FIG. 3 is a block diagram showing a conventional expansion circuit.

FIG. 3 is a block diagram showing a conventional expansion circuit for expanding the compressed data of PCM signal. In FIG. 3, reference numeral 9 designates a shift register, 10 a down counter, and 11 an AND circuit. Referring to FIG. 3, compressed data and a range signal are supplied to a data input terminal 4 and a range-signal input terminal 5, respectively. A reset-signal input terminal 8 is supplied with a reset signal for starting a data expanding operation. The reset signal is applied to a load terminal 14 of the shift register 9 and to a load terminal 18 of the down counter 10. The shift register 9 is loaded with the compressed data applied to parallel input terminals 12 of the shift register 9, and the down counter 10 is loaded with the range signal applied to an input terminal 17 of the down counter 10. A clock signal supplied to a clock input terminal 6 is applied through the AND circuit 11 to a clock input terminal 15 of the shift register 9 and to a clock input terminal 19 of the down counter 10. When the clock signal is supplied to the shift register 9 and down counter 10, the input data loaded in the shift register 9 is shifted, and the down counter 10 counts down the range signal loaded therein.

The expansion circuit shown in FIG. 3 can be used when a PCM signal applied thereto accompanies a range signal. In more detail, the expansion circuit is used in the case where compressed data is transmitted together with a range signal [0], [1], [2] or [3] indicating which of the zero-th, first, second and third ranges has been used, in compressing the data of PCM signal in accordance with the compression characteristic shown in FIG. 1. Referring to FIG. 3, a transmitted PCM signal is divided into data indicating the amplitude of audio signal and a range signal. The data and range signal are supplied to the data input terminal 4 and range-signal input terminal 5, respectively. As mentioned previously, the data of a PCM signal is compressed in such a manner that one or more lower bits of an input signal are cut off when the signal level of the input signal is high. Accordingly, in the expansion circuit, the data of a transmitted PCM signal is shifted by a predetermined number of bits, and one or more bits corresponding to the number of bits cut off in a compression circuit are added to the shifted data at the position following the least significant bit of the shifted data, to expand the data of the transmitted PCM signal. The range signal indicates the number of bits added to the shifted data. In other words, the range signal indicates which of the ranges $a_0$ to $a_3$ has been used in compressing the data of PCM signal, that is, how many bits have been cut off in data compression. The PCM signal supplied to the input terminal 4 is applied to the parallel input terminals 12 of the shift register 9, and one block of the PCM signal loaded from the parallel input terminals 12 in the shift register 9, for example, compressed 8-bit data is shifted in the direction toward the most significant bit of the shift register, by one bit in synchronism with the clock signal applied to the clock input terminal 15, each time the clock signal is applied to the terminal 15. The range signal supplied to the input terminal 5 is applied to the input terminal 17 of the down counter 10. The range signal indicates the number of bits cut off in data compression, as mentioned previously. The down counter 10 counts down the range signal loaded therein, in response to the clock signal applied to the input terminal 19. For example, in the case where three lower bits of the data of a PCM signal were cut off in compressing the data, the range signal indicates the number of cut off bits (namely, 3), and the down counter 10 counts down the numerical value 3 on the basis of the clock signal. At this time, the shift register 9 shifts the whole data loaded therein in the direction toward the most significant bit of the register 9, in synchronism with the clock signal. Accordingly, when the range signal loaded in the down counter 10 is made equal to zero by three clock pulses, the whole data in the shift register 9 is shifted in the direction toward the most significant bit thereof by three bits, and thus a 3-bit data area is formed following the least significant bit of the shifted data. When the contents of the down counter 10 become equal to zero, the signal level at an output terminal 20 of the down counter 10 becomes "L (low)", and therefore the clock signal is prevented from being applied to the shift register 9 and down counter 10. Thus, the data expanding operation in the expansion circuit is stopped, and expanded data is given to a data output terminal 7.

The PCM signal outputted from the output terminal 7 is applied to a subtractor (not shown), in which the offset value having been added in the compression is subtracted from the PCM signal.

Figure 4:
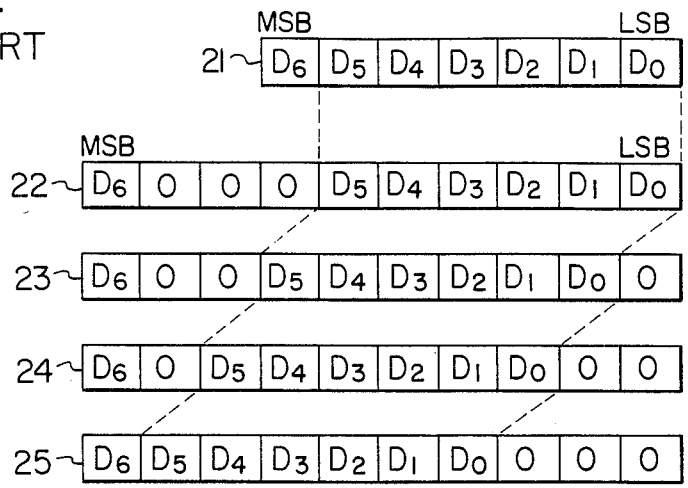
FIG. 4 is a view for explaining the data expansion according to prior art.

FIG. 4 shows a few examples of data expansion performed in the case where a 10-bit PCM signal has been compressed into a 7-bit signal. In FIG. 4, reference numeral 21 designates one block of compressed data, 22 expanded data corresponding to the case where the zero-th range $a_0$ is used to obtain the compressed data 21, 23 expanded data corresponding to the case where the first range $a_1$ is used for data compression, 24 expanded data corresponding to the case where the second range $a_2$ is used for data compression, and 25 expanded data corresponding to the case where the third range $a_3$ is used for data compression. Each of these expanded data is one block of data. The most significant bit $D_6$ of the compressed data 21 is a sign bit for indicating one of positive and negative signs, and is used in the most significant bit of each expanded data, as it is. The remaining bits of the compressed data, namely, six bits $D_0$ to $D_5$ are shifted in accordance with one of the ranges $a_1$ to $a_3$. The data 22 corresponds to the case where the zero-th range is used for data compression, that is, an input data is not compressed. Accordingly, when the expanded data 22 is formed, the data bits $D_0$ to $D_5$ are not subjected to bit shift, but only the sign bit $D_6$ is moved to the most significant bit of the expanded data 22, and three 0's (zero's) are inserted between the sign bit $D_6$ and data bit $D_5$. The data 23 is obtained by adding one bit to the shifted data bits at the position following the least significant bit $D_0$ of the shifted data bits and inserting two 0's between the sign bit $D_6$ and data bit $D_5$. In the expansion circuit, the data 21 is generally subjected to bit shift, and then one or more 0's are given to a bit area following the bit $D_0$ through a serial input terminal 13. The input-output characteristic of the expansion circuit obtained in the case where data compression and expansion are performed in the above-mentioned manner, is indicated by a waveform 3 in FIG. 2. If quantization noise is neglected, the input-output characteristic obtained when ordinary, linear processing is performed for a PCM signal, will be linear as indicated by a broken line 1, and the input-output characteristic obtained when the above-mentioned data compression and expansion are performed, will be nonlinear as indicated by a broken line 2. Such a nonlinear characteristic causes a signal distortion, and therefore is a serious problem for an audio PCM signal which requires high-quality transmission.

When a PCM signal is compressed and then expanded in the above-mentioned manner, one or more lower bits cut off for the purpose of data compression cannot be compensated in expanding the compressed signal, and therefore a signal distortion is generated. In more detail, when the compressed signal is expanded, one or more lower bits are added to the compressed signal. However, the contents of one or more added bits are zero, and therefore do not always agree with a signal which was cut off in compressing the PCM signal. Thus, a signal distortion is generated.

Figure 5:
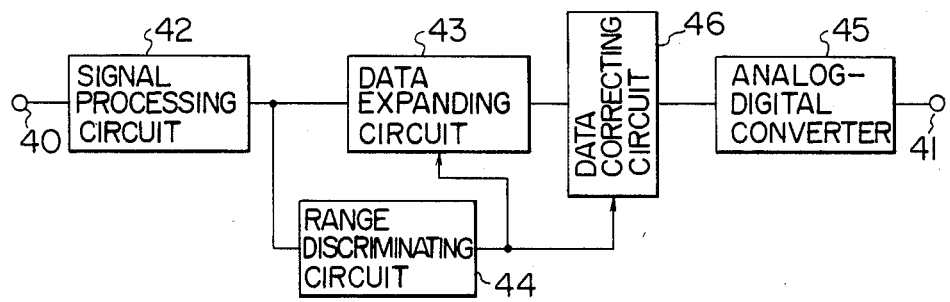
FIG. 5 is a block diagram showing a PCM signal demodulating circuit according to the present invention.

FIG. 5 is a block diagram showing a PCM-signal demodulating circuit according to the present invention. Referring to FIG. 5, a PCM signal which has been transmitted or recorded in a recording medium, is supplied to an input terminal 40. The PCM signal from the input terminal 40 is applied to a signal processing circuit 42, in which the coding error and drop-out generated in the course of transmission or recording are corrected and compensated. The PCM signal thus processed is supplied from the signal processing circuit 42 to a data expanding circuit 43 and a range discriminating circuit 44. The range discriminating circuit 44 reads out a range signal included in the PCM signal, and judges which of the ranges $a_0$ to $a_3$ has been used to compress the data of PCM signal. The output of the range discriminating circuit 44 is supplied to the data expanding circuit 43. In the circuit 43, the data of the PCM signal from the signal processing circuit 42 is subjected to bit shift on the basis of the output signal of the range discriminating circuit 44, to expand the data. The PCM signal having the expanded data is supplied from the data expanding circuit 43 to a data correcting circuit 46. Further, a signal indicating a range number which is determined by the range discriminating circuit 44, is applied to the data correcting circuit 46. In the circuit 46, correction data is given to one or more lower bits which have been increased by the data expanding circuit 43, on the basis of the range number determined by the range discriminating circuit 44. The data correcting circuit 46 also subtracts the offset value which has been added in the compression from the PCM signal on the basis of the range signal. The output signal of the data correcting circuit 46 is applied to a digital-analog converter 45, to convert the PCM signal into an analog signal, which is delivered to an output terminal 41.

Figure 6:
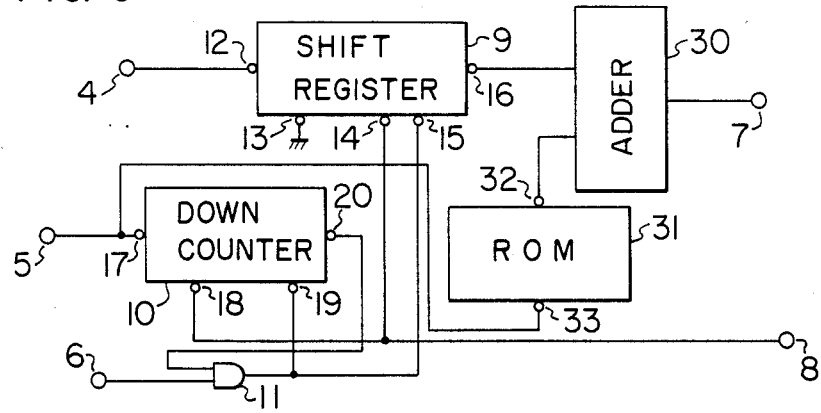
FIG. 6 is a block diagram showing an embodiment of an expansion circuit according to the present invention.

FIG. 6 is a block diagram of a circuit part which includes the data expanding circuit 43, range discriminating circuit 44 and data correcting circuit 46 shown in FIG. 5. In FIG. 5, reference numeral 9 designates a shift register, 10 a down counter, 11 an AND circuit, 30 an adder, and 31 a read only memory (ROM). Referring to FIG. 6, compressed data and a range signal are supplied to a data input terminal 4 and a range-signal input terminal 5, respectively. A reset-signal input terminal 8 is supplied with a reset signal for starting a data expanding operation. The reset signal from the input terminal 8 is applied to a load terminal 14 of the shift register 9 and to a load terminal 18 of the down counter 10. The shift register 9 is loaded with the compressed data applied to parallel input terminals 12 of the shift register 9, and the down counter 10 is loaded with the range signal applied to an input terminal 17 of the down counter 10. A clock signal supplied to a clock input terminal 6 is applied through the AND circuit 11 to a clock input terminal 15 of the shift register 9 and to a clock input terminal 19 of the down counter 10. When the clock signal is supplied to the shift register 9 and down counter 10, the input data loaded in the shift register 9 is shifted, and the down counter 10 counts down the range signal loaded therein. Further, an address input terminal 33 of the ROM 31 is connected to the range-signal input terminal 5, and therefore the range signal is supplied to the ROM 31. The ROM 31 stores therein binary correction data (0), (1), (10) and (100) corresponding respectively to the ranges $a_0$, $a_1$, $a_2$ and $a_3$. When the range signal is applied to the address input terminal 33 of the ROM 31, correction data corresponding to the range signal is delivered to a data output terminal 32. The adder 30 is applied with the correction data from the ROM 31 and the expanded data of PCM signal which is obtained by the bit shift performed in the shift register 9, to give the correction data to one or more lower bits of the expanded data which have been increased by the shift register 9.

Figure 7:
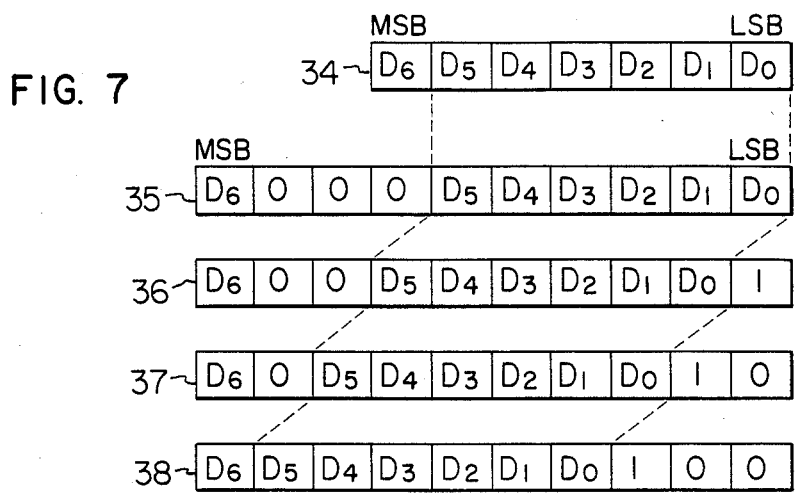
FIG. 7 is a view for explaining the data expansion according to the present invention.

FIG. 7 shows cases where correction data is given to one or more lower bits of the expanded data of PCM signal. In FIG. 7, data 34 indicates one block of compressed data of PCM signal. Data 35, 36, 37 and 38 are formed by shifting the data 34 by 0 bit, one bit, two bits and three bits, respectively. The data 35 is expanded data corresponding to the case where no lower bit is cut off in forming the data 34. In more detail, FIG. 7 shows cases where one block of a PCM signal, that is, 10-bit data is compressed in 7-bit data and then the 7-bit data is expanded to 10-bit data which is one block of a PCM signal. As mentioned above, the 10-bit data 35 corresponds to the case where no lower bit is cut off in data compression, and therefore is obtained by inserting three bits between bits $D_6$ and $D_5$ of the data 34 and giving a value "0" to each of the inserted bits. The data 36 corresponds to the case where one lower bit was cut off in data compression, and is obtained by shifting all of the data bits $D_0$ to $D_5$ by one bit and giving correction data (1) to the least significant bit. The correction data (1) given to the least significant bit is supplied from the ROM 31 to the adder 30. The data 37 is obtained by shifting all of the data bits $D_0$ to $D_5$ of the data 34 by two bits and giving binary correction data (10) to two lower bits. Further, the data 38 is obtained by shifting all of the data bits $D_0$ to $D_5$ by three bits and giving binary correction data (100) to three lower bits.

Figure 8:
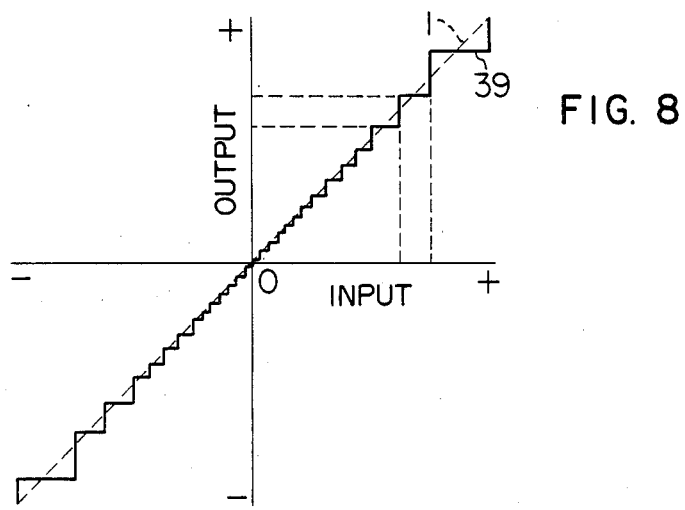
FIG. 8 is a graph showing the input-output characteristic of an expansion circuit according to the present invention.

In the case where the data of PCM signal is compressed and the compressed data is expanded, a signal distortion is generated on the basis of the fact that the stepwise output waveform 3 shown in FIG. 2 deviates to the right from the linear characteristic indicated by the broken line 1, when only positive input signals are taken into consideration. The broken line 2 shown in FIG. 2 is obtained by integrating the output signal 3 and taking mean values of output signals. Accordingly, the deviation of the broken line 2 from the linear characteristic 1 causes the signal distortion. In order to eliminate the signal distortion, it is necessary to cause the stepwise output waveform 3 to project from the linear characteristic 1 on both sides thereof by the same amount. In other words, it is necessary that the broken line 2 obtained by the integration of the output signal 3 is put on the linear characteristic 1. In the expansion circuit shown in FIG. 6, data to be expanded is shifted by three bits, at most. The largest one of binary numbers expressed by three bits is (111), which corresponds to a decimal number 7. In the case where compressed data is shifted by three bits to expand the compressed data, a numerical value 4, namely, (100) which is about one half the numerical value 7, is given to three lower bits of expanded data. Output signals thus obtained are distributed equally on both sides of the linear characteristic 1, as shown in FIG. 8, and therefore values obtained by the integration of the output signals are put on the linear characteristic 1. Thus, the generation of signal distortion is prevented. Incidentally, a numerical value 3, namely, (011) which is about one half the numerical value 7, may be used as the correction data, in place of the numerical value 4, namely, (100). The binary number (100) given to the three lower bits of the expanded data is correction data stored in the ROM 31. The ROM 31 delivers the correction data (100) in accordance with the range signal.

Similarly, in the case where compressed data is shifted by two bits, a binary number (10) corresponding to a numerical value 2 which is about one half the largest number 3 expressed by two bits, is used as the correction data, and is given to two lower bits of expanded data. Incidentally, a numerical value 1, namely, (01) which is about one half the numerical value 3, may be used as the correction data, in place of the numerical value 2, namely, (10). Further, in the case where compressed data is shifted by one bit, a numerical value 1 is used as the correction data. As shown in FIG. 8, an output waveform 39 obtained by using these correction data is distributed equally on both sides of the linear characteristic 1.

Further, the ROM 31 stores the offset values which have been added to the PCM signal in the compression, so that the ROM 31 outputs, on the basis of the range signal, a corresponding offset value which is used by the adder 30 for subtraction operation.

Figure 9:
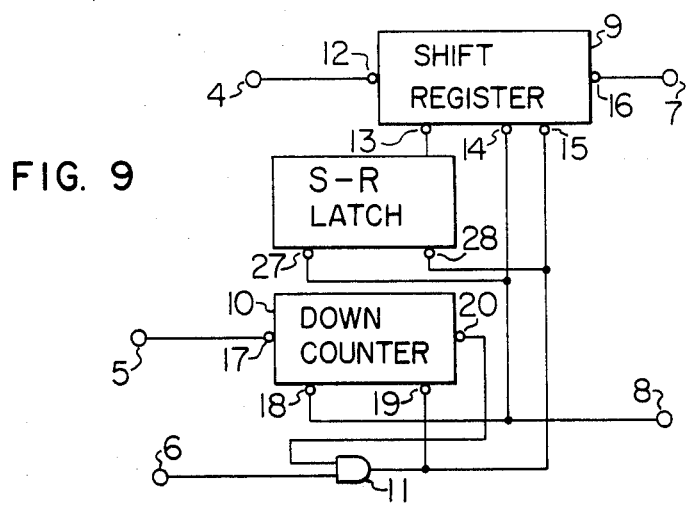
FIG. 9 is a block diagram showing another embodiment of an expansion circuit according to the present invention.

FIG. 9 is a block diagram showing another embodiment of a data expanding circuit according to the present invention. In FIG. 9, reference numeral 26 designates an S-R latch or flip-flop, 27 a set input terminal of the S-R latch 26, and 28 a reset input terminal of the S-R latch 26. The S-R latch 26 is set by a reset signal supplied from an input terminal 8. When the reset signal is supplied to the input terminal 8, the S-R latch 26 is put in the set-state, and a numerical value "1" is supplied from the S-R latch 26 to a serial input terminal 13 of a shift register 9. Accordingly, after the data of the shift register 9 has been shifted, the numerical value "1" is given to the least significant bit of the shift register 9. Next, the S-R latch 26 is reset by a clock signal supplied from an input terminal 6. Accordingly, in the second and following data shifting operations, a numerical value "0" is given to the least significant bit of the shift register 9 after the data of the shift register has been shifted by one bit. Thus, as shown in FIG. 7, in the case where the first range $a_1$ has been used for data compression, the numerical value (1) is given to the least significant bit of expanded data. In the case where the second range $a_2$ has been used for data compression, the binary correction data (10) is given to two lower bits of expanded data. Further, in the case where the third range $a_3$ has been used, the binary correction data (100) is given to three lower bits of expanded data.

In the foregoing description, explanation has been made on the case where a PCM signal accompanies a range signal. However, even when a PCM signal does not accompany a range signal but contains information of the range signal therein, a data expanding operation can be performed in the following manner. Numerical values each indicating the boundary between adjacent ones of ranges which are used in compressing data, are previously known. Accordingly, a register for storing therein the numerical values indicating the above boundary and a comparator for comparing an input data signal with a numerical value indicating the boundary between adjacent ranges, are added to the data expanding circuit, the numerical values each indicating the boundary between adjacent ranges are successively supplied, as a reference signal, from the register to the comparator, the input data signal is compared with the reference signal by the comparator, to judge which of the ranges has been used for data compression, and correction data is given to one or more lower bits of expanded data on the basis of the range thus determined.

As has been explained in the foregoing, the input-output characteristic of an expansion circuit according to the present invention, for digital data having been subjected to nonlinear compression has excellent linearity, and therefore the signal distortion due to the nonlinearity of input-output characteristic can be reduced.

We claim:

1. An expansion circuit for digital signals, said expansion circuit being applied with a digital signal whose data has been compressed in such a manner that a predetermined number of bits are cut off from a plurality of bits forming said digital signal, to expand said compressed data, said expansion circuit comprising:
    a shift register applied with said compressed digital signal for shifting a plurality of bits forming said compressed digital signal to add one or more bits to said shifted bits at the position following the least significant bit of said shifted bits;
    judging means applied with said compressed digital signal for judging the number of bits having been cut off in compressing said data, to supply said shift register with information with respect to the number of bits, by which said compressed digital signal is shifted in said shift register, including counter means for changing its count content in response to clock pulses, to generate an output signal when its count content has changed by a predetermined number corresponding to the number of bits to be added; and
    adding means applied with said information from said judging means, for giving correction data to said one or more added bits, said correction data being a numerical value which is about one half the largest one of numerical values expressed by one or more bits, by which said compressed digital signal is shifted in said shift register.

2. An expansion circuit according to claim 1, wherein said adding means includes memory means storing said correction data, and responsive to a signal representing the number of bits having been cut off, for outputting the corresponding correction data.

* * * * *